United States Patent [19]

Cuomo et al.

[11] 4,446,403

[45] May 1, 1984

[54] COMPACT PLUG CONNECTABLE ION SOURCE

[75] Inventors: Jerome J. Cuomo, Lincolndale; James M. E. Harper, Yorktown Heights, both of N.Y.; Harold R. Kaufman, Fort Collins, Colo.

[73] Assignee: International Business Machines Corporation, Armonk, N.Y.

[21] Appl. No.: 382,266

[22] Filed: May 26, 1982

[51] Int. Cl.³ .............................................. H01J 7/24
[52] U.S. Cl. ................... 315/111.81; 250/426; 250/423 R; 313/161; 313/231.41; 313/363.1; 315/111.01; 315/111.41
[58] Field of Search ....................... 315/111.01, 111.41, 315/111.81; 250/423, 426; 313/230, 231.01, 231.41, 161, 360.1, 363.1

[56] References Cited

U.S. PATENT DOCUMENTS

| | | | |
|---|---|---|---|
| 2,975,279 | 3/1961 | Craig | 313/423 |
| 3,115,591 | 12/1963 | Brunnee | 313/231.01 |
| 3,408,283 | 10/1968 | Chopra et al. | 250/426 |
| 3,742,275 | 6/1973 | Gutow | 313/360.1 |
| 3,913,320 | 10/1975 | Reader et al. | 313/363 |

*Primary Examiner*—Harold Dixon
*Attorney, Agent, or Firm*—Pollock, Vande Sande & Priddy

[57] ABSTRACT

A compact ion source plug connected to a socket is provided. The source uses a magnetic pole piece which includes a center pole piece and a surrounding circumferential pole piece to form an arcuate fringe field. Cathode elements and anode elements are located within the fringe field for producing a plasma. A source body terminates at one end with at least one grid and forms a plasma chamber with a base member. All of the electrical connections to the plasma generator and the gas connection are through a plug formed on the opposite side of the base member.

8 Claims, 6 Drawing Figures

COMPACT PLUG CONNECTABLE ION SOURCE

DESCRIPTION

Technical Field

A compact detachable ion source is described for generating low energy ion beams. Specifically, a multi-grid plug mounted ion source is provided which permits generation of a controlled sputtering beam with a variable beam width and variable energy level.

Ion sputtering beams are used in the circuit component fabrication art to deposit metallic particles on a component substrate or to remove metal from a substrate. The ion generators are housed within a vacuum chamber with a target which is to be bombarded. After sputtering the target whereby atomic particles are removed from the target surface, the workpiece which receives the sputtered particles in a deposition process is subject to further processing steps.

In order to improve the manufacturing efficiency of the circuit production process, additional process steps are performed on the workpiece in the vacuum chamber. For instance, a thin film evaporation step may be included with an ion sputtering cleaning step. It is therefore necessary to minimize the amount of space taken up by the ion source within the vacuum chamber while maintaining beam size of the ion generator to permit other operations to take place.

One of the difficulties in incorporating ion bombardment process steps with other process steps results from the space requirements for the magnetic pole pieces used in the ion generator for a given beam diameter. Further, the interconnections with the ion generator reduces the ability to position the beam within the ion generator, thereby requiring certain space within the vacuum chamber to be dedicated to the sputtering process.

SUMMARY OF INVENTION

It is an object of this invention to provide a compact detachable ion source for machining substrate surfaces.

It is a more particular object of this invention to provide a high current ion beam generator which is plug mounted in a vacuum chamber.

It is yet another object of this invention to provide an ion source which can be easily removed and disassembled to replace cathode elements and screen grids during routine maintenance.

These and other objects are accomplished by apparatus in accordance with the invention. A detachable ion generator is provided having an insulating base member with a plurality of connecting pins for mating with a socket. A gas port is provided in the base member for admitting an ionizing gas.

The base member includes on one side thereof magnetic pole pieces which form an arcuate extending magnetic fringe field. Supported to the base member are cathode and anode elements. The cathode element comprises a filament wire detachable from a pair of supports. The anode element is similarly supported to the base member. The anode and cathode elements are positioned with respect to each other such that electrons which migrate from the cathode towards the anode must enter the fringe field.

A source body forms an enclosure with the base member forming a plasma chamber for a gas entering through the base member. The source body is terminated at a remaining end with at least one grid. A second accelerator grid may be provided spaced apart from the first grid.

All connections to the ion generator cathode, anode, and grids are through the base member making the ion generator detachable from the socket. The ionizing gas enters the generator through the base member. Electrons emitted from the cathode migrate to the anode colliding with the gas molecules. The magnetic fringe field will increase the path length of travel for the electrons thereby increasing the number of collisions producing an ion rich plasma. The magnetic pole piece arrangement permits the ion source to be compact. The socket may be pivotably mounted in the chamber which will result in the ion beam being positionable.

DESCRIPTION OF THE PREFERRED EMBODIMENT

Figure 1:
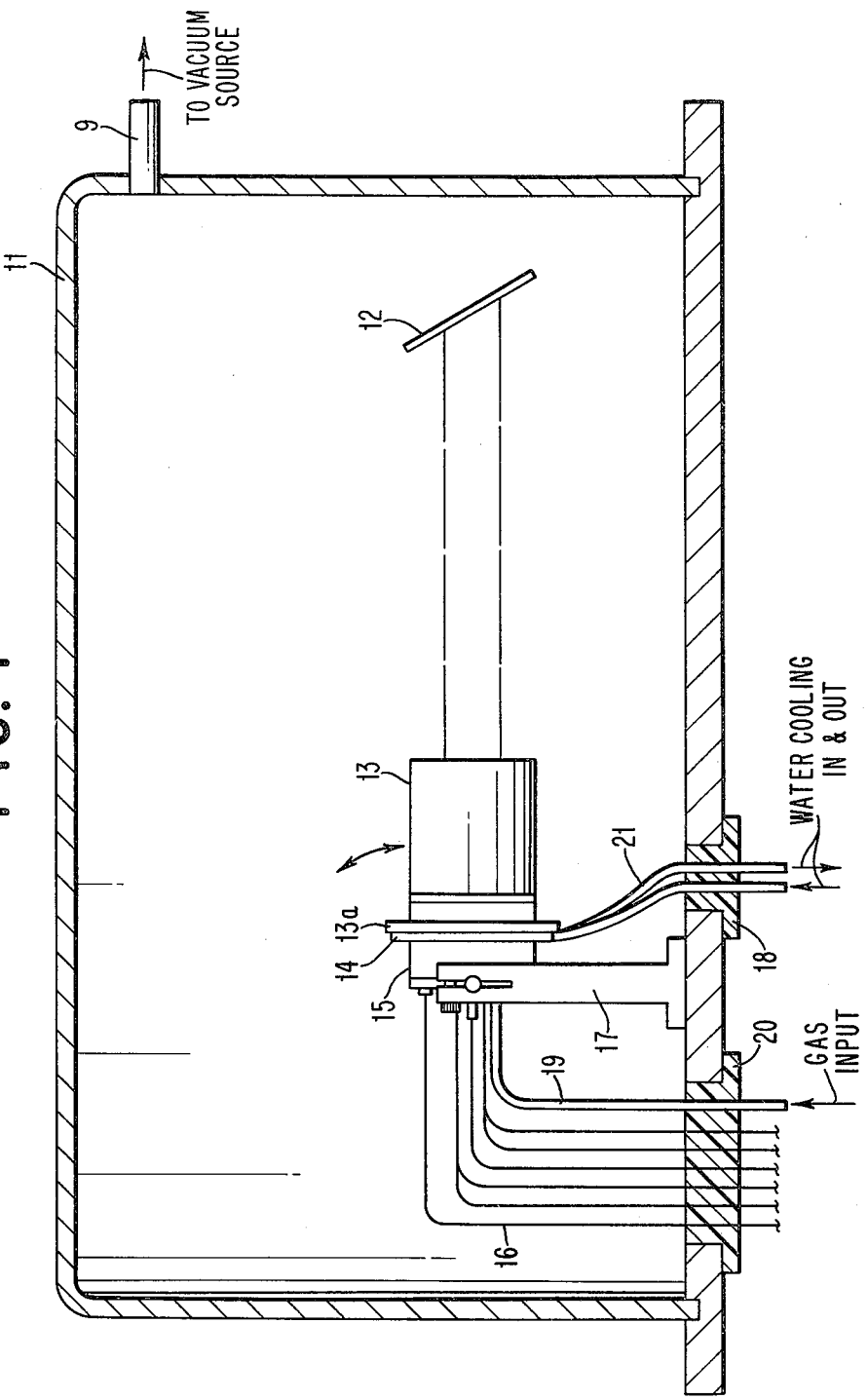
FIG. 1 illustrates the arrangement of an ion generator in accordance with the present invention.

Referring now to FIG. 1 there is shown an arrangement of a sputtering apparatus using an ion source 13 in accordance with a preferred embodiment of the invention. A vacuum chamber 11 provides a low pressure environment for sputtering atomic particles from a substrate 12. An ion source 13 includes a base member 13a having a plurality of electrical pins which are received in a socket 15. A water cooling plate 14 is placed between the ion source 13, base member 13a, and socket 14. Socket 15 includes a plurality of electrical wires which carry a voltage potential to each of the cooperating pins of base member 13a. A gas line 19 is connected to an aperture in socket 15 for supplying an ionizing gas which is typically argon. First and second feedthroughs 18, 20 are provided for permitting the water coolant lines 21 and cables 16 to exit the chamber 11. A vacuum is applied to the chamber 11 through an inlet port 9.

Figure 2:
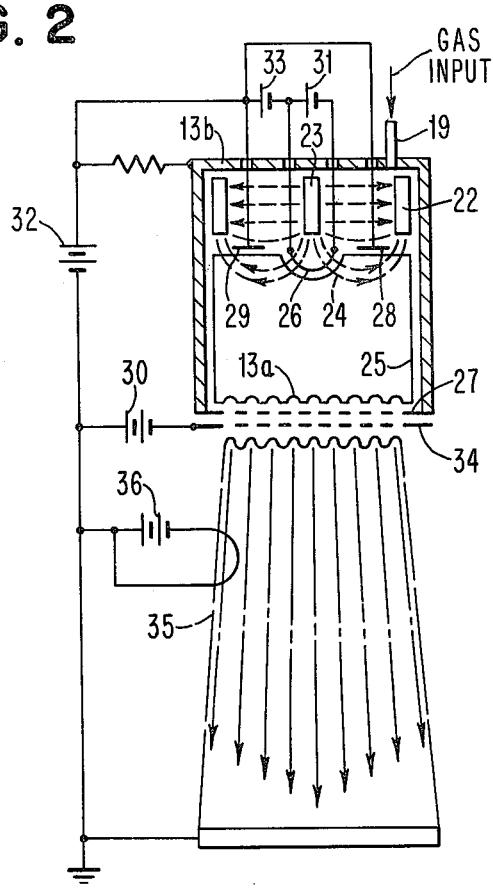
FIG. 2 is an operational diagram of the structure of the ion generator of FIG. 1.

FIG. 2 is a schematic representation of the ion generator 13. Gas enters an inlet 19 of the plasma chamber within the source body of ion generator 13. A first magnetic pole piece 22 circumferentially encloses a second pole piece 23. The magnetic pole pieces 22, 23 generate an arcuate extending fringe field 24. Located within the fringe field is a cathode 26 which emits electrons in response to an electrical current supplied by a voltage source 31. First and second anode elements 28, 29 also extend outward into the fringe magnetic field 24.

Magnetic fringe field 24 comprises arcuate, radially extending components beginning at the central axis of the generator terminating near the plasma generator walls. The cathode 26 is centrally located with respect to the center pole piece 23. The anode elements are located to each side of the center pole piece 23 whereby the field components includes an optimally located anode. The cathode and anode are placed so electrons which migrate from the cathode to the anode pass through the magnetic fringe field. The magnetic fringe field provides for an ion enriched plasma by increasing the effective path length for the electrons.

The structure of pole pieces 22 and 23 includes a central longitudinal pole piece 23 and a circumferentially extending pole piece 22. The arcuate field components 24 which result from the structure permit the manufacture of a compact ion source 13. The resulting field will produce sufficient collisions between gas molecules and free electrons to produce ions. The ions produce a plasma which is bounded by a sheath 25.

The ion source 13 has first and second opposite ends 13a, 13b which include openings for receiving electrical connections to the anode and cathode elements, and which delivers ions generated within ion source 13. The exit end 13a of the ion source includes at least one screen grid 27 having a plurality of exit apertures for emitting ions. Also shown in FIG. 2 is an accelerator grid 34. The accelerator grid 34 is electrically isolated from screen grid 27 and has a potential applied by voltage source 30. The grids 27, 34 are standard graphite grids with aligned apertures.

The remaining voltage sources 32, 33 maintain a voltage potential on the anodes and maintain the cathode 26 more negative than the anodes 28, 29. A neutralizing filament 35 is placed in the ion beam to add neutralizing electrons to the beam in a known manner. The neutralizing filament 35 and associated voltage source 36 is external to the ion source and is common to many sputtering apparatuses.

The gas, such as argon or other well known ionizing gasses entering the ion generator 13 is maintained at a pressure of 0.1 m Torr and flow of 0.06 TL/S. The voltage potential in ion generator 13 is illustrated in FIG. 3.

Figure 3:
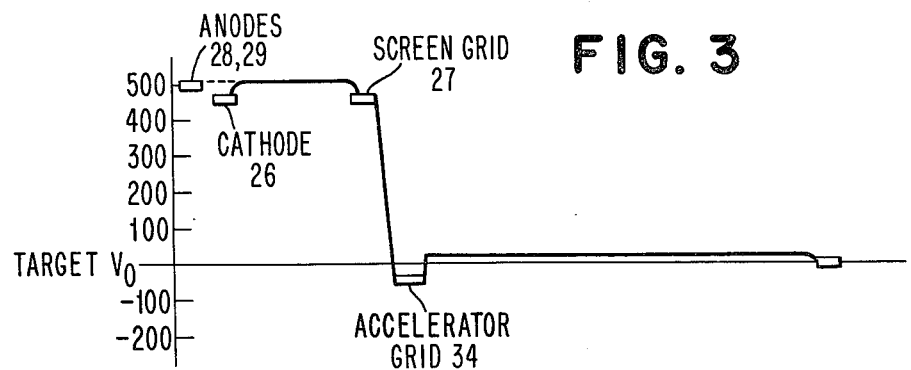
FIG. 3 illustrates the operating voltage potential distribution for the ion generator of FIG. 2 under typical operating conditions.

Referring now to FIG. 3, there is shown the voltage potential on individual elements within the ion source 13 with respect to ground. The anode potential is typically held to 500 volts. The cathode 26 is maintained slightly negative by typically 40 volts of the anodes 28, 29. Electrons from the filament 26 migrate towards the anode 28, 29, under the influence of the magnetic fringe field 24 colliding with gas molecules generating ions.

The first screen grid 27 assumes a potential of slightly less than the anode 28, 29 potential due to electron impact with the screen grid. Accelerator grid 34 is maintained at 50 volts negative with respect to the target potential. The ion stream exiting the ion source assumes a potential imposed by the target sheath of approximately +5 volts. The ion beam energy is approximately 500 ev. The accelerator grid voltage can be adjusted to a more negative value which will increase the ion current. However, the accelerator grid 34 acts as a defocussing lens, and divergence is minimized by keeping the accelerator grid 34 potential less negative. Therefore effective control over the beam divergence may be achieved by adjusting the accelerator grid 34 potential.

The ion generator 13 can also be implemented with a single exit grid which replaces the accelerator grid 34. When using an ion source of this type, a single grid 27 is located at the position of accelerator grid 34. The single grid is maintained at a slightly negative potential to prevent electron back streaming.

Figure 4:
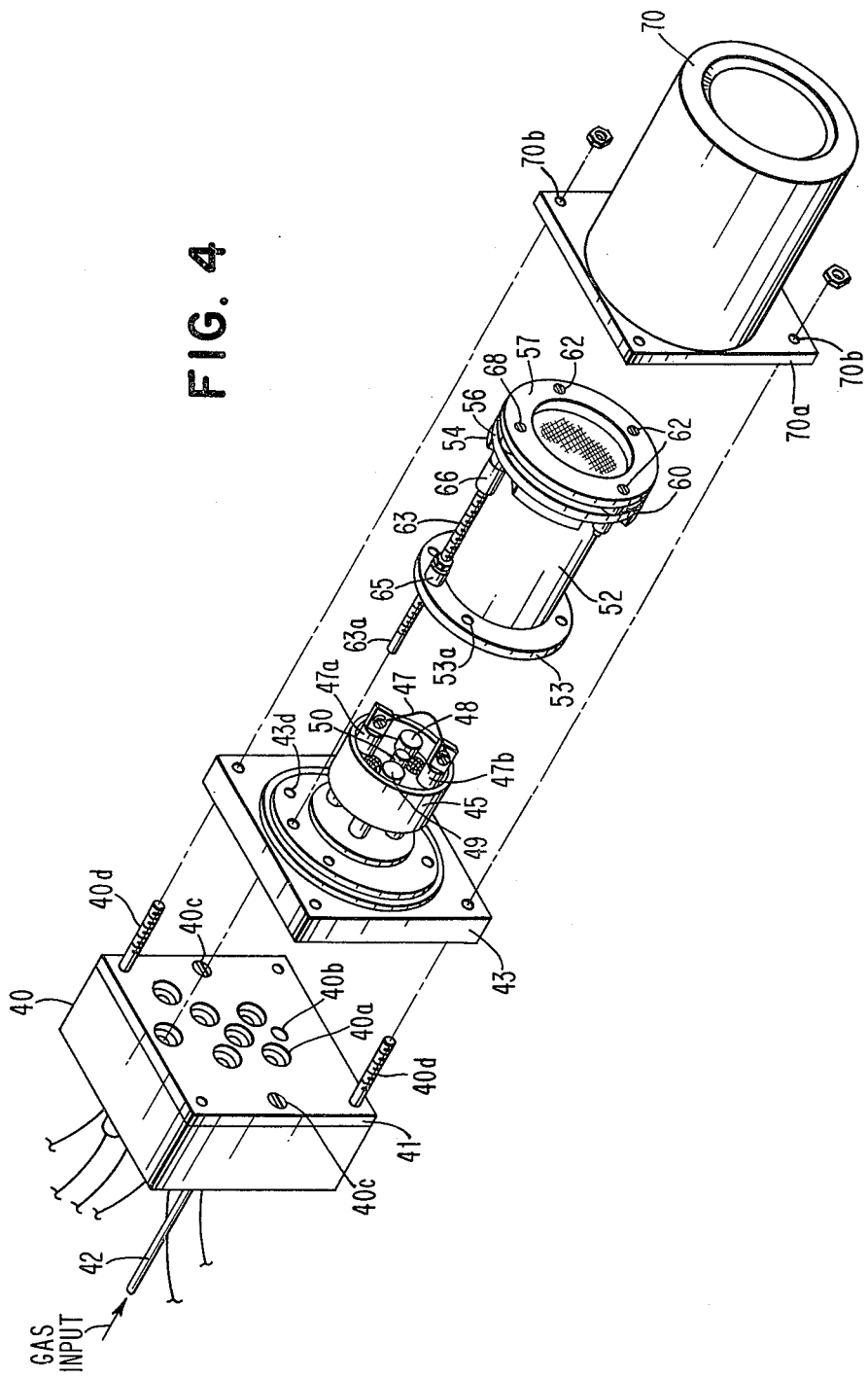
FIG. 4 is an exploded diagram of an ion generator in accordance with a preferred embodiment of the invention.
Figure 5:
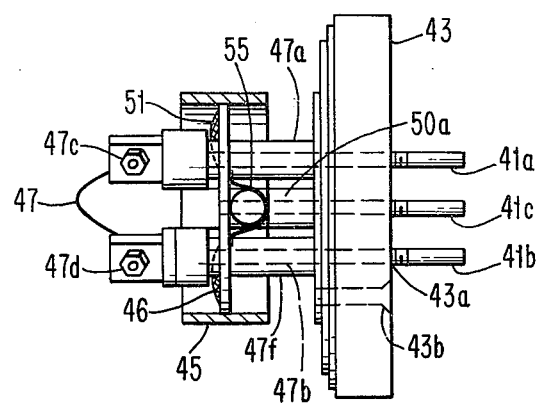
FIG. 5 is another view of the magnetic pole pieces and cathode structure of the ion generator of FIG. 3.

Referring now to FIG. 4, there is shown the exploded illustration of an ion generator 13 having the structure shown in FIG. 2. A socket 40 is provided having a plurality of connectors 40a for receiving mating pins from base member 43. The pins provide electrical connections to the cathode 47, anode 48, 49, polepiece 50 and acceleration grid 57. A cooling plate 41 is provided attached by two screws 40c to the socket 40 in higher power applications to keep heat from spreading from the ion source. A gas line 42 is inserted in the rear of the socket 40 in an aperture 40b which extends through the socket 40. A communicating aperture 43b, as shown in FIG. 5, is provided on base member 43 for receiving the entering gas. In practice, a small section of tubing is epoxied to the exit side of aperture 40b for sealingly connecting aperture 40b with aperture 43b. Other techniques for ensuring good gas flow between the socket 40 and base member aperture 43b will be evident to those skilled in the art. A plurality of apertures 43a, also shown in FIG. 5 receive electrical connecting pins for mating with connectors 40a.

Figure 6:
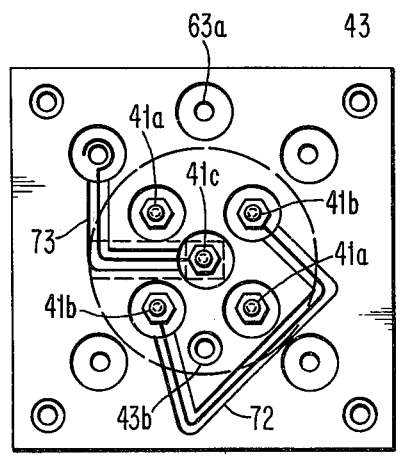
FIG. 6 is a bottom view of the base member 43 of FIG. 1.

The remaining side of base member 43 includes a first magnetic pole piece 45 which circumferentially encloses anodes 48, 49 and cathode filament 47. A centrally located second magnetic pole piece 50 extends a distance to be in line with the edge of the outer edge of pole piece 45. The first magnetic pole piece 45 has a base section including 4 clearance holes for the anodes 48, 49 and cathode supports 47a, 47b. Base member 43 includes apertures 43a for receiving the cathode supports 47a, 47b threaded conductors comprising pins 41a. Referring specifically to FIG. 5, there are shown the cathode supports 47a, 47b. The anode supports are not shown, but are identical in construction to the cathode supports 47a, 47b. The cathode supports 47a, 47b as shown in FIG. 5 include a central threaded conducting pin 41a surrounded by an insulating member 47f which extends through the pole piece 45. Threaded conducting pin 41c threads with the pole piece 50 and extends through base member 43. Pins 41a, 41c have a threaded portion which threads with a like thread in apertures 43a. Alternatively, the supports 47a, 47b may be secured with a nut on the far side of the base member 43 as shown in FIG. 6. Two additional screen covered apertures 46 and 51 are included in the base portion of first magnetic pole piece 45 for emitting argon. Cathode supports 47a, 47b are terminated with first and second filament connectors 47c and 47d which facilitates replacement of filament 47. Although not shown in FIG. 5 anodes 49 and 48 are identically supported by threaded pins 41b and insulators in apertures 43a of the base member 43 as indicated in FIG. 6. The anodes 49, 48 have a length which places them in the fringe field of the magnetic pole pieces 45 and 50. A permanent magnet 55 is located behind the magnetic pole pieces 45, 50. The magnet is selected to have a magnetic field strength in the range of 20–50 oe. The magnet 55 is shown more particularly in FIG. 5. The magnet 55 is bonded with a strap to the underside of the pole piece 45. A pin 41a passes through pole piece 45 and has threaded thereto pole piece 50 with a spacer 50a. FIG. 6 illustrates the relative position of the anode connecting pins 41b and the remaining connecting pins 41a, 41c.

Referring again to FIG. 4, a source body 52 forms a plasma chamber for the ionizing gas. The source body has an inside diameter sufficient to enclose the magnetic pole piece 45. The source body 52 has first and second flanges 53, 54. The first flange 53 is included with a set of mounting holes 53a which receive mounting screws. The mounting screws fasten the source body to the base member 43 through a like set of tapped holes 43d in the base member.

The remaining flange 54 is located at the exit end of the source body 52 and supports in the embodiment shown two screen grids 56, 57. Flange 54 includes a plurality of holes which are coincident with a plurality of holes on the rim of screen grid 56 which is electrically connected to the source body 52. Another set of holes on the rim of screen grid 56 are in alignment with a like set of holes on the rim of screen grid 57. Spacers 60 mechanically and electrically maintain the two screen grids a distance apart. The spacers 60 and screen grids 57 and 56 are held together by three fasteners 62 and screw 68. The grids are placed in registry to permit maximum ion flow.

The screen grid 57 serves as an accelerator grid. The electrical connections to the accelerator grid 57 is made by a rod 63. Rod 63 passes through a hole in flange 53 of the source body 52. A bushing 65 is inserted in the flange 53 hole to maintain rod 63 electrically isolated from flange 53. The end of rod 63 bears a metallic support 66 which includes a screw thread for receiving a screw 68 which holds the accelerator grid 57 to the rod. The screw 68 electrically connects the accelerator grid 57 with the rod 63. A clearance hole in grid 56 insulates the rod 63 from grid 56. The end of rod 63 extends through one of the plurality of apertures in the base member 43 forming a pin 61a for connection with a connector 40a in socket 40.

Thus connection of the accelerator grid 57 is accomplished by the extending end of rod 63 forming an electrical pin 63a which is received in one of connectors 40a. All electrical connections to the ion source are formed by the pins 41a, 41b, 41c and 63a.

A ground shield 70 is located around the source body 52. A hole pattern is included on a flange 70a. Two of the holes 70b receive a pair of threaded studs 40d which protrude from socket 40. The remaining holes of flange 70a receive screws for holding the flange 70a to the socket 40.

Referring now to FIG. 6, there is shown the rear side of base member 43. The base member includes two jumper wires 72 and 73. Jumper wire 72 connects the two anodes 48, 49 together to maintain the same potential on both pins. Jumper wire 73 electrically connects the magnet pole pieces 45 and 50 with the source body 52 through an extension of one of the mounting screws associated with aperture 53a.

Thus, there is described a detachable compact ion source which receives all electrical connections through an electrical socket as well as the required gas feed. The detachable ion source may be disassembled to permit replacement of a broken filament or grid replacement. The source may be operated with a single grid or with an accelerator grid depending upon the desired ion beam intensity. The magnetic pole structure permits a minimum package size while maintaining adequate ionization within the ion source plasma chamber.

INDUSTRIAL APPLICATION

A compact plug detachable ion source is provided which may be removed from a sputtering chamber. The ion source may be disassembled for cathode or grid replacement.

Having thus described my invention, what I claim as new, and desire to secure by Letters Patent is:

1. An ion generator comprising:
    a socket member, said socket member having a plurality of apertures containing electrical connectors, and a further aperture for receiving a gas feed tube;
    a mating base insulator including a plurality of electrical pins on one side thereof for mating with said electrical connectors, said insulator base pins extending through said base insulator to an opposite side thereof and including a gas feed aperture extending through said insulator to said opposite side facing said socket member further aperture;
    a magnet assembly located on said base insulator opposite side including a center pole piece and an outer pole piece circumferentially surrounding said center pole piece, said pole pieces providing an arcuate extending magnetic fringe field between ends of said pole pieces;
    a filament member connected between a pair of said pins extending into said magnetic field forming a cathode;
    an anode member spaced apart from said cathode and connected to one of a remaining of said plurality of pins;
    a source body for enclosing said cathode, anode, and magnet assembly having one end abutting said insulator and a remaining open end, said source body forming an ionization chamber;
    first and second grid members connected to said open end, said grid members each electrically connected to one of a pair of said electrical pins, said grid members forming exit apertures for ions within said ionization chamber, said base insulator, source body and grid members forming a detachable ion generator having electrical pins for mating with said socket whereby electrical voltages and an ionizing gas are provided to said ion generator.

2. The ion generator of claim 1 further comprising a cooling plate adjacent said socket member, said cooling plate having first and second connections for receiving a cooling fluid.

3. The ion generator of claim 1 wherein said cathode and anode are separated by said fringe field whereby collisions of free electrons with gas molecules are increased by electrons which migrate from said cathode through said fringe field.

4. An ion generator comprising:
    a socket having a plurality of apertures including electrical connectors, and an aperture for receiving an ionizing gas;
    an insulating base having a plurality of pins having one end for engaging said connectors, and an aperture located opposite said socket gas receiving aperture, the remaining ends of said pins extending through said insulating base;
    a magnet assembly including a first pole piece forming an enclosure located on said base, and a second pole piece centrally located within said enclosure, the ends of said pole pieces forming a radially extending magnetic field;
    at least one anode element located within said enclosure and extending toward the ends of said pole pieces,
    said anode elements connected through said magnet assembly to ends of two of said pins;
    first and second cathode elements located between said anode elements and extending towards the ends of said pole pieces, said cathode elements connected together by a filament wire, whereby electrons released by said cathode elements traverse a portion of said radially extending magnetic field before reaching said anode elements;

a source body for enclosing said anode, cathode elements, and magnet assembly, said source body open at one end thereof; and a pair of spaced apart grids having a plurality of aligned apertures, said grids terminating said source body open end, whereby a plurality of exit apertures are provided for delivering ions.

5. An ion generator comprising:

a socket for providing electrical connections with an external power source, said socket having on one side thereof a plurality of electrical connections located within a plurality of apertures, and a gas inlet, a base member having a plurality of electrical pins extending therethrough and an aperture for a receiving gas, said base member pins arranged to permit insertion of said pins with said socket connections and said gas inlet facing said aperture for receiving a gas;

first and second magnetic pole pieces located on a side of said base member, said pole pieces providing an arcuate magnetic fringe field;

a filament element supported in said fringe field, said filament element forming a cathode, said filament having first and second ends electrically connected to two of said plurality of pins;

an anode element supported in said fringe field, said anode element connected to one of the remaining of said plurality of pins;

a source body forming an enclosure with said base member for said anode, cathode and magnetic pole pieces having said source body open at one end for emitting charged particles; and a screen member enclosing said one end and having a plurality of exit apertures for emitting ions.

6. The ion generator of claim 5 further comprising a ground shield for enclosing said source body open at an end adjacent said screen grid whereby ions are free to escape said screen grid, said ground shield electrically connected to one of said pins whereby said ground shield is connected to a source of voltage potential.

7. The ion generator of claim 5 further comprising an accelerator grid spaced apart from said screen member and electrically isolated therefrom said accelerator grid having a plurality of apertures aligned with said screen apertures, said accelerator grid electrically connected to one of said pins whereby a voltage potential is received on said accelerator grid.

8. The ion generator of claim 5 wherein said magnetic poles pieces provide first and second arcuately extending fringe fields, extending from the central axis of said source body to said source body.

* * * * *

UNITED STATES PATENT AND TRADEMARK OFFICE
CERTIFICATE OF CORRECTION

PATENT NO. : 4,446,403

DATED : May 1, 1984

INVENTOR(S) : Cuomo et al

It is certified that error appears in the above-identified patent and that said Letters Patent is hereby corrected as shown below:

Column 6, line 68, "cathode elements" should read -- filament wire --.

Column 8, line 8, "having" should read --, --.

Claim 6, line 15, after "escape" insert -- through --.

Signed and Sealed this

Twelfth Day of March 1985

[SEAL]

Attest:

DONALD J. QUIGG

*Attesting Officer*  *Acting Commissioner of Patents and Trademarks*